(12) United States Patent
Chung et al.

(10) Patent No.: US 7,544,538 B2
(45) Date of Patent: Jun. 9, 2009

(54) METHOD OF FORMING SEMICONDUCTOR CHIPS, THE SEMICONDUCTOR CHIPS SO FORMED AND CHIP-STACK PACKAGE HAVING THE SAME

(75) Inventors: Hyun-Soo Chung, Gyeonggi-do (KR); Seung-Kwan Ryu, Gyeonggi-do (KR); Ju-Il Choi, Gyeonggi-do (KR); Dong-Ho Lee, Gyeonggi-do (KR); Seong-Deok Hwang, Seoul (KR)

(73) Assignee: Samsung Electronic Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/775,120

(22) Filed: Jul. 9, 2007

(65) Prior Publication Data

US 2008/0014735 A1    Jan. 17, 2008

(30) Foreign Application Priority Data

Jul. 7, 2006    (KR) ............... 10-2006-0063936

(51) Int. Cl.
*H01L 21/44* (2006.01)
*H01L 21/48* (2006.01)
*H01L 21/50* (2006.01)

(52) U.S. Cl. ............. 438/106; 438/612; 438/613; 257/678; 257/737; 257/E21.499; 257/E21.502; 257/E21.503; 257/E21.508; 257/E21.511

(58) Field of Classification Search ............ 438/106, 438/112, 118, 122, 127, 128, 612, 613, 667, 438/668; 257/678, 737
See application file for complete search history.

(56) References Cited

U.S. PATENT DOCUMENTS

| 5,622,899 | A  | * | 4/1997  | Chan et al. ............... 438/9 |
| 6,455,408 | B1 | * | 9/2002  | Hwang et al. ............. 438/613 |
| 6,492,198 | B2 | * | 12/2002 | Hwang ..................... 438/108 |
| 6,551,856 | B1 | * | 4/2003  | Lee ......................... 438/108 |
| 6,621,164 | B2 | * | 9/2003  | Hwang et al. ............. 257/738 |
| 6,825,511 | B2 | * | 11/2004 | Song et al. ............... 257/209 |
| 2002/0185710 | A1 | | 12/2002 | Zandman et al. |
| 2006/0138671 | A1 | * | 6/2006 | Watanabe .................. 257/773 |

FOREIGN PATENT DOCUMENTS

| JP | 2005-26582      | 1/2005 |
| KR | 1994-0018951    | 8/1994 |
| KR | 10-2004-0071645 | 8/2004 |
| KR | 10-2005-0021078 | 3/2005 |
| KR | 10-2006-0010099 | 2/2006 |

OTHER PUBLICATIONS

English language abstract of Japanese Publication No. 2005-26582.
English language abstract of Korean Publication No. 10-2005-0021078.
English language abstract of Korean Publication No. 10-2006-0010099.

* cited by examiner

*Primary Examiner*—David Nhu
(74) *Attorney, Agent, or Firm*—Marger Johnson & McCollom, P.C.

(57) ABSTRACT

Provided are methods of fabricating semiconductor chips, semiconductor chips formed by the methods, and chip-stack packages having the semiconductor chips. One embodiment specifies a method that includes patterning a scribe line region of a semiconductor substrate to form a semiconductor strut spaced apart from edges of a chip region of the semiconductor substrate.

15 Claims, 10 Drawing Sheets

METHOD OF FORMING SEMICONDUCTOR CHIPS, THE SEMICONDUCTOR CHIPS SO FORMED AND CHIP-STACK PACKAGE HAVING THE SAME

CROSS-REFERENCE TO RELATED APPLICATIONS

This U.S. non-provisional patent application claims priority under 35 U.S.C. § 119 to Korean Patent Application No. 2006-63936 filed on Jul. 7, 2006, the entirety of which is hereby incorporated by reference.

BACKGROUND

1. Field of the Invention

The present invention relates to method of forming semiconductor chips, to the semiconductor chips so formed, and to a chip-stack package having the semiconductor chips.

2. Description of the Related Art

As electrical appliances are continually reduced in both size and weight, various methods of packaging semiconductor chips have been studied to replace the conventional method of wire-bonding in an attempt to help reduce the size and weight of the semiconductor packages used in the electrical appliances. Some of these packaging methods involve flip-chip bonding, wafer-level packaging, wafer-level stack packaging, and chip-stack packaging.

In the case of the chip-stack packaging, stacked semiconductor chips are electrically connected by through vias formed in the semiconductor chips. This may result in shorter length interconnects, which may provide high performance, high speed, low power consumption, and microminiaturization as compared to some of the other conventional packaging methods.

However, a semiconductor chip built in a chip-stack package typically involves a complicated fabrication process. This fabrication process typically includes the following steps. A connection hole is formed at edges of the semiconductor chip and filled with a metal layer, and then the metal layer is polished. However, before the connection hole is filled with the metal layer, an insulation layer, a barrier metal layer, and a seed layer are generally sequentially and conformally formed in the connection hole. The insulation layer helps prevent a leakage current. The barrier metal layer helps prevent the metal layer from being diffused. The seed layer aides in conformally and easily forming the metal layer. These processes for forming the semiconductor chip built in the chip-stack package, however, are very complicated. Furthermore, the thickness of the insulation layer formed in the connection hole is restricted by a width of the connection hole. Therefore, it is not easy to form the insulation layer having sufficient thickness to prevent the leakage current.

SUMMARY

The present invention provides a method of forming a semiconductor chip that can be simplified, while helping reduce a leakage current. The present invention also provides a semiconductor chip formed by the method and a chip-stack package having the semiconductor chip.

An example embodiment of the present invention provides a method of fabricating the semiconductor chips. The method includes patterning a scribe line region of a semiconductor substrate to form a semiconductor strut spaced apart from a chip region of the semiconductor substrate. A conductive pattern may be formed at a surface of the semiconductor strut. Alternatively, impurity ions may be doped into the semiconductor strut. This shows that the semiconductor strut may be used as a means of an outer connection terminal. Therefore, the method of fabricating semiconductor chips according to the present invention does not need a seed layer, a barrier metal layer, and an insulation layer resulting in a significantly simplified fabrication process. Furthermore, when the semiconductor strut is formed, it is easy to control the gap between the semiconductor strut and the semiconductor substrate to prevent a leakage current. Additionally, sizes and features of the semiconductor strut may be easily controlled to be suitable for sizes and features of a sequential bump, thereby improving a reliability of semiconductor chips.

More particularly, the method of fabricating a semiconductor chip according to this example embodiment includes preparing a semiconductor substrate including a chip region and a scribe line region, forming a bonding pad on the chip region of the semiconductor substrate, forming a protective layer exposing a portion of the scribe line region and the bonding pad but covering the semiconductor substrate, forming a redistribution pattern contacting the bonding pad and covering the exposed scribe line region of the semiconductor substrate, and removing a portion of the semiconductor substrate located below the redistribution pattern at the scribe line region to form a semiconductor strut contacting the redistribution pattern.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
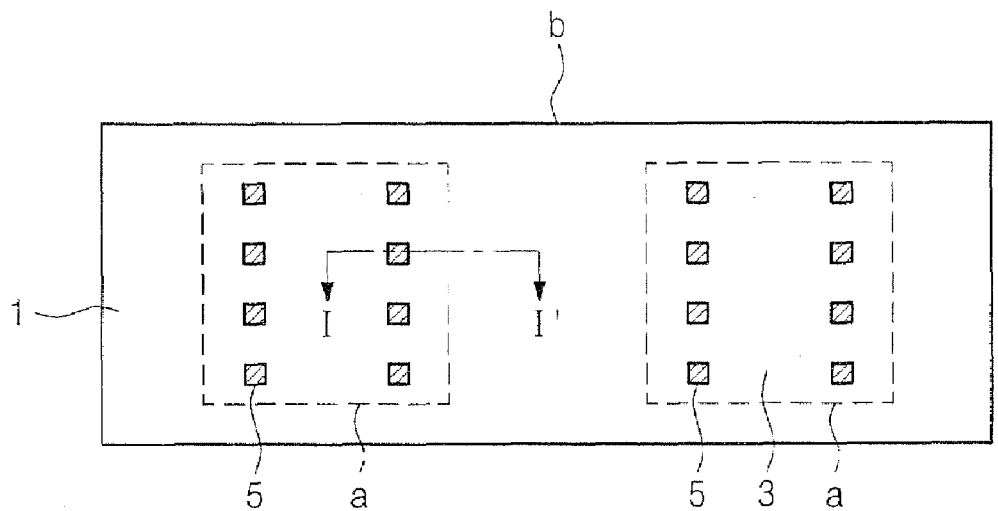
FIGS. 1 through 4 are plan views illustrating a method of forming a semiconductor chip according to an embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer, region or substrate is referred to as being "on" another element, it can be directly on the other element or intervening elements may also be present.

Furthermore, relative terms, such as "beneath", may be used herein to describe one element's relationship to another element as illustrated in the Figures. It will be understood that relative terms are intended to encompass different orientations of the device in addition to the orientation depicted in the Figures. For example, if the device in the Figures is turned over, elements described as "below" other elements would then be oriented "above" the other elements. The exemplary term "below", can therefore, encompasses both an orientation of above and below.

It will be understood that although the terms first and second are used herein to describe various regions, layers, and/or sections, these regions, layers, and/or sections should not be limited by these terms. These terms are only used to distinguish one region, layer, or section from another region, layer, or section. Thus, a first region, layer, or section discussed below could be termed a second region, layer, or section, or vice versa without departing from the teachings of the present invention. Like numbers refer to like elements throughout.

Figure 8:
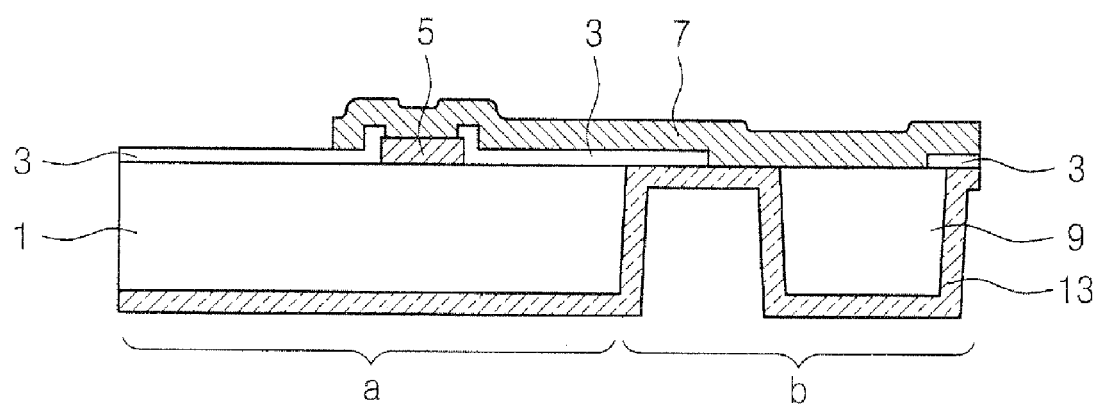
Figure 9:
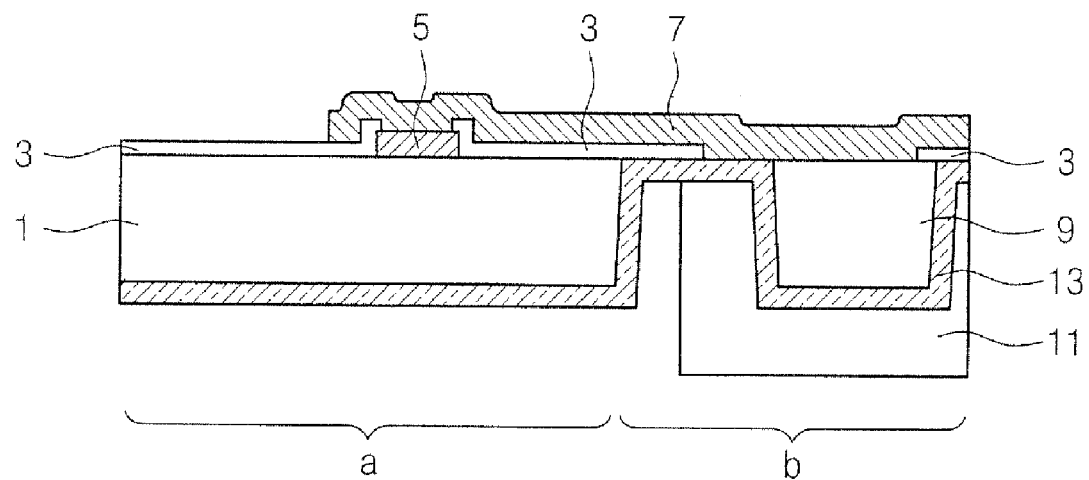
Figure 10:
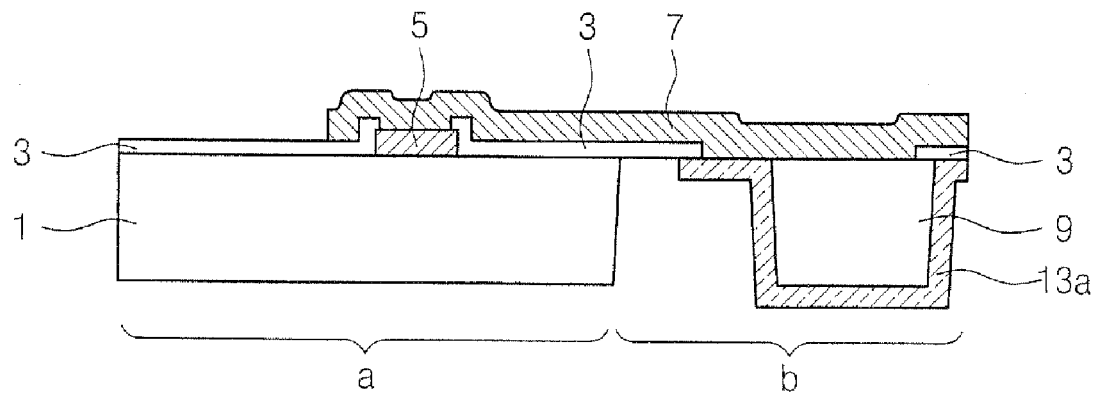

FIGS. 1 through 4 are plan views illustrating a method of forming a semiconductor chip according to an embodiment of the present invention. FIGS. 5 through 11 are sectional views illustrating a method of forming a semiconductor chip according to an embodiment of the present invention. FIGS. 5, 6, 7, and 11 are sectional views taken along lines I-I' in FIGS. 1 through 4, respectively. FIGS. 8 through 10 are sectional views illustrating detailed procedures of forming a semiconductor chip of FIG. 11.

Figure 5:
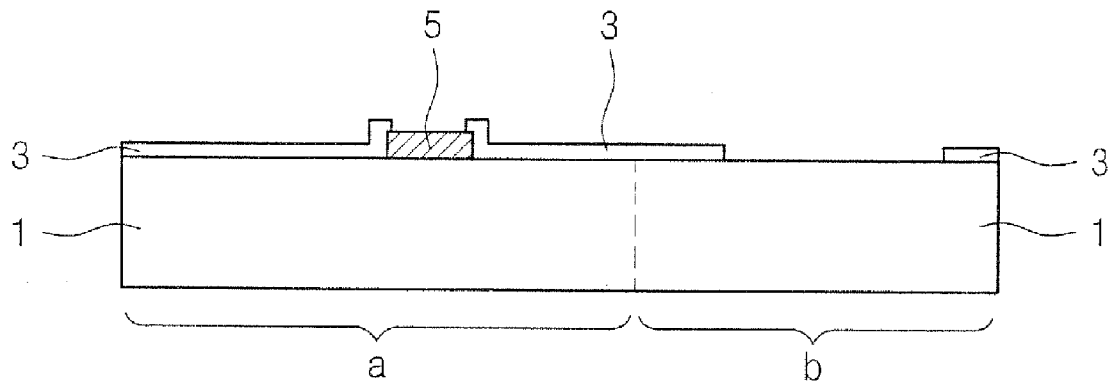
FIGS. 5 through 11 are sectional views illustrating a method of forming a semiconductor chip according to an embodiment of the present invention.

Referring to FIGS. 1 and 5, a semiconductor substrate 1 having a chip region a and a scribe line region b is prepared. Although two neighboring chip regions a are arranged in FIG. 1, the chip regions a may be arranged repeatedly in horizontal and/or vertical direction(s). The chip regions a are surrounded by the scribe line region b. Although not shown, various devices such as transistors, interconnects, resisters, contacts, etc. may be formed over the semiconductor substrate 1. A bonding pad 5 is formed on the semiconductor substrate 1. The bonding pad 5 may be electrically connected to the various devices described above. The bonding pad 5 may be formed by forming and patterning an aluminum layer. A protective layer 3 is stacked on the bonding pad 5. The protective layer 3 may be formed of a double layer of a silicon nitride layer and a polyimide layer. The protective layer 3 functions by protecting the various devices from outer moisture. The protective layer 3 is patterned to expose a portion of the bonding pad 5 in the chip region a, and a portion of the semiconductor substrate 1 in the scribe line region b.

Figure 2:
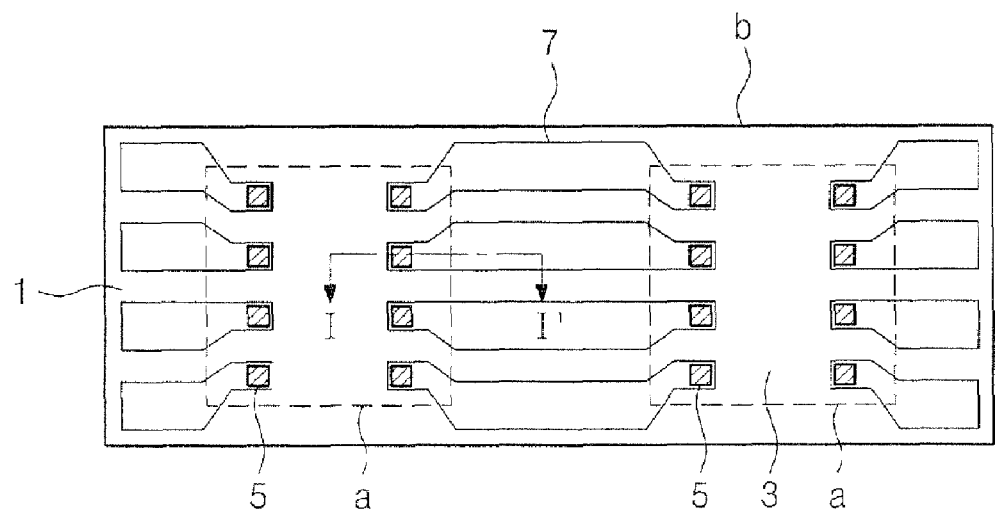
Figure 6:
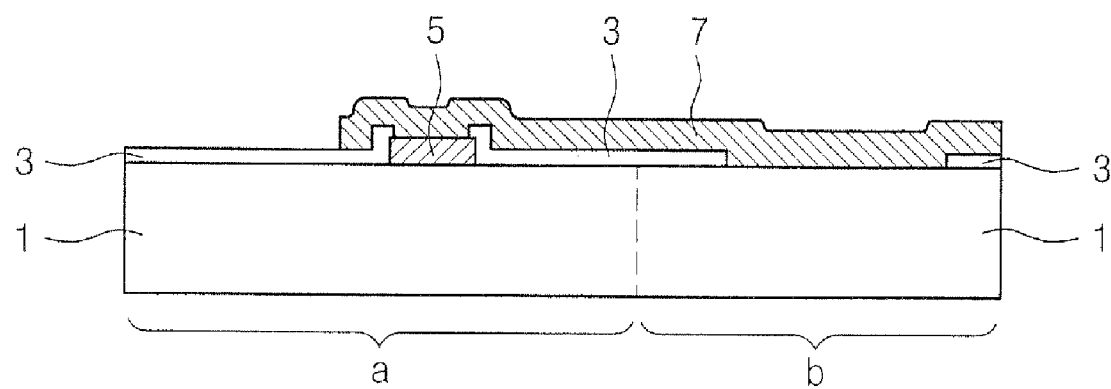

Referring to FIGS. 2 and 6, a redistribution pattern 7 is formed on the semiconductor substrate 1. The redistribution pattern 7 may be formed of copper, nickel, or gold by using an electroplating method. The redistribution pattern 7 may be formed to contact the bonding pad 5 and the semiconductor substrate 1 exposed at the scribe line region b. The redistribution pattern 7 may be formed to cross over the scribe line region b and to respectively connect at least one of the bonding pads 5 of two neighboring chip regions a.

Figure 3:
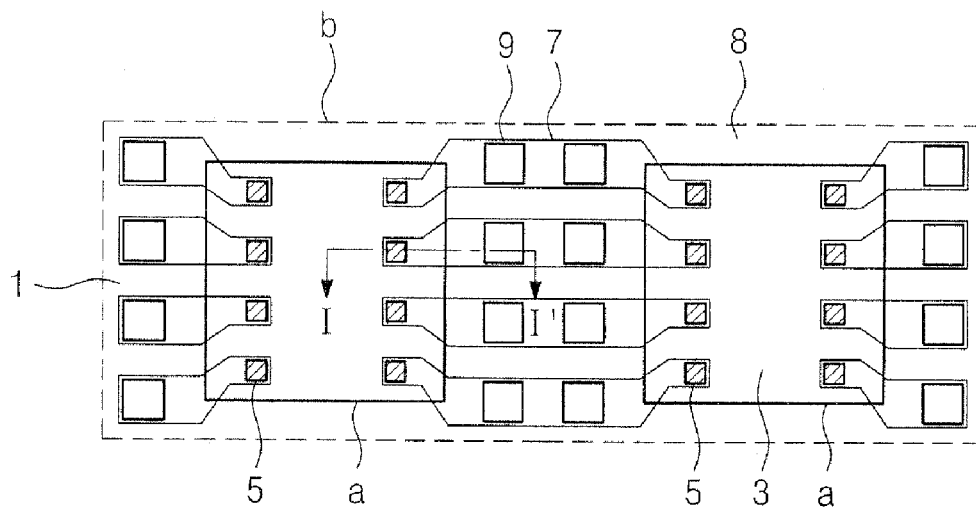
Figure 7:
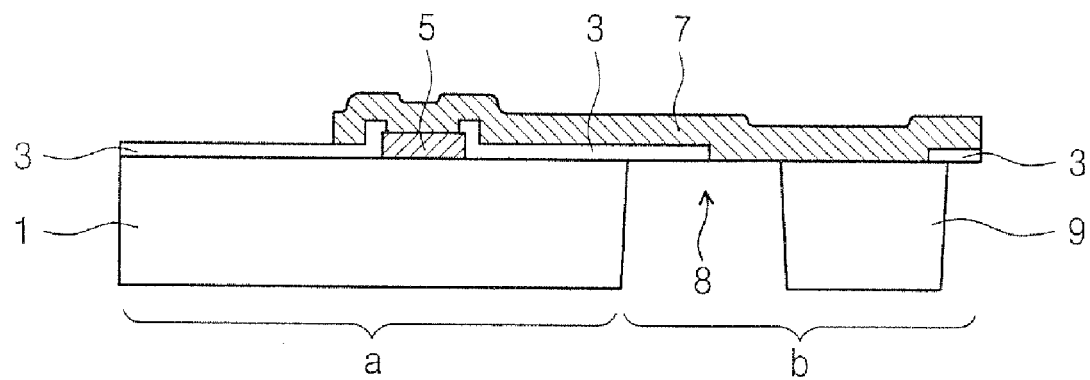

Referring to FIGS. 3 and 7, a portion of the semiconductor substrate 1 is etched in the scribe line region b to form a semiconductor strut 9. In detail, the semiconductor strut 9 may be formed using a photolithography process, a dry/wet etch process, and/or a laser drilling process. Before forming the semiconductor strut 9, the backside of the semiconductor substrate 1 may be ground or polished to decrease the thickness of the semiconductor substrate 1. The semiconductor strut 9 is formed to be spaced apart from the chip region a of the semiconductor substrate 1. Therefore, an opening 8 is formed between the semiconductor strut 9 and the semiconductor substrate 1, where the opening 8 may expose a portion of the redistribution pattern 7 and the protective layer 3. The semiconductor strut 9 may be formed to have isolated-island shapes. However, sizes and shapes of the semiconductor strut 9 may be changed along features of a bump. The width of the opening 8 may also be changed optionally. The semiconductor strut 9 may have the same semiconductor single-crystalline structure as the semiconductor substrate 1 and, for example, be formed of silicon single crystalline.

The semiconductor strut 9 may function as a support when a semiconductor chip is mounted on a mounting substrate such as a printed circuit board. Additionally, when a high voltage is applied on the semiconductor strut 9, the semiconductor strut 9 may be conductive. Therefore, the semiconductor strut 9 may function as an electrode by itself. However, the semiconductor strut 9 may have a larger electric resistance than other conductors. Therefore, in order to decrease this electric resistance, the following procedures may be carried out.

Referring to FIG. 8, a metal layer 13 is conformally formed on the backside of the semiconductor substrate 1 to cover the semiconductor substrate 1, the semiconductor strut 9, and the protective layer 3 and redistribution pattern 7 exposed by the hole 8. The metal layer 13 may be formed of aluminum, titanium, tantalum, or tungsten by using a sputtering method.

Referring to FIG. 9, a mask pattern 11 is formed on a bottom surface of the metal layer 13 on the back side of the semiconductor substrate 1 to cover the semiconductor strut 9. The mask pattern 11, however, may be spaced apart from edges of the chip region a of the semiconductor substrate 1. The mask pattern 11 may be a photoresist pattern.

Figure 4:
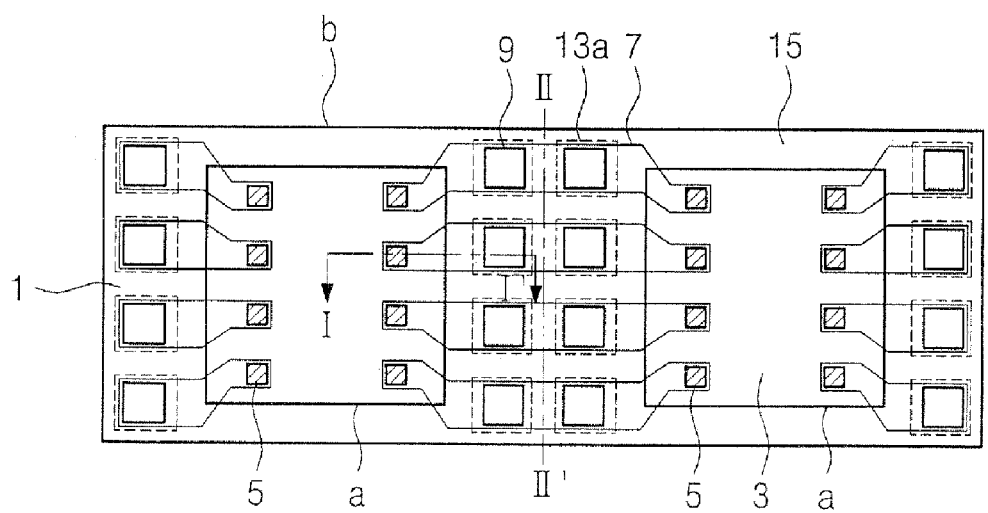

Referring to FIGS. 4 and 10, the metal layer 13 is etched using the mask pattern 11 as an etch mask, thereby forming a metal pattern 13a covering a bottom surface and a sidewall of the semiconductor strut 9 and contacting the redistribution pattern 7. Then, the mask pattern 11 is removed. An edge of the metal pattern 13a may be formed to contact the protective layer 3. During this process the protective layer 3 may function as an etch stopper. If this process is finished in the state of FIG. 10, there may exist a risk that the semiconductor strut 9 may be separated from the redistribution pattern 7 and the protective layer 3 because of the weight of the semiconductor strut 9. In order to prevent this separation from occurring, the following process may be carried out.

Figure 11:
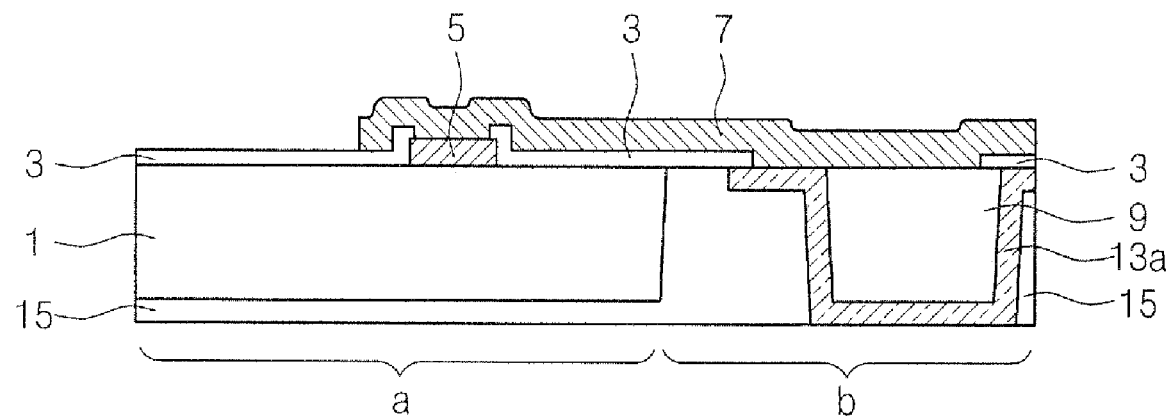
Figure 12:
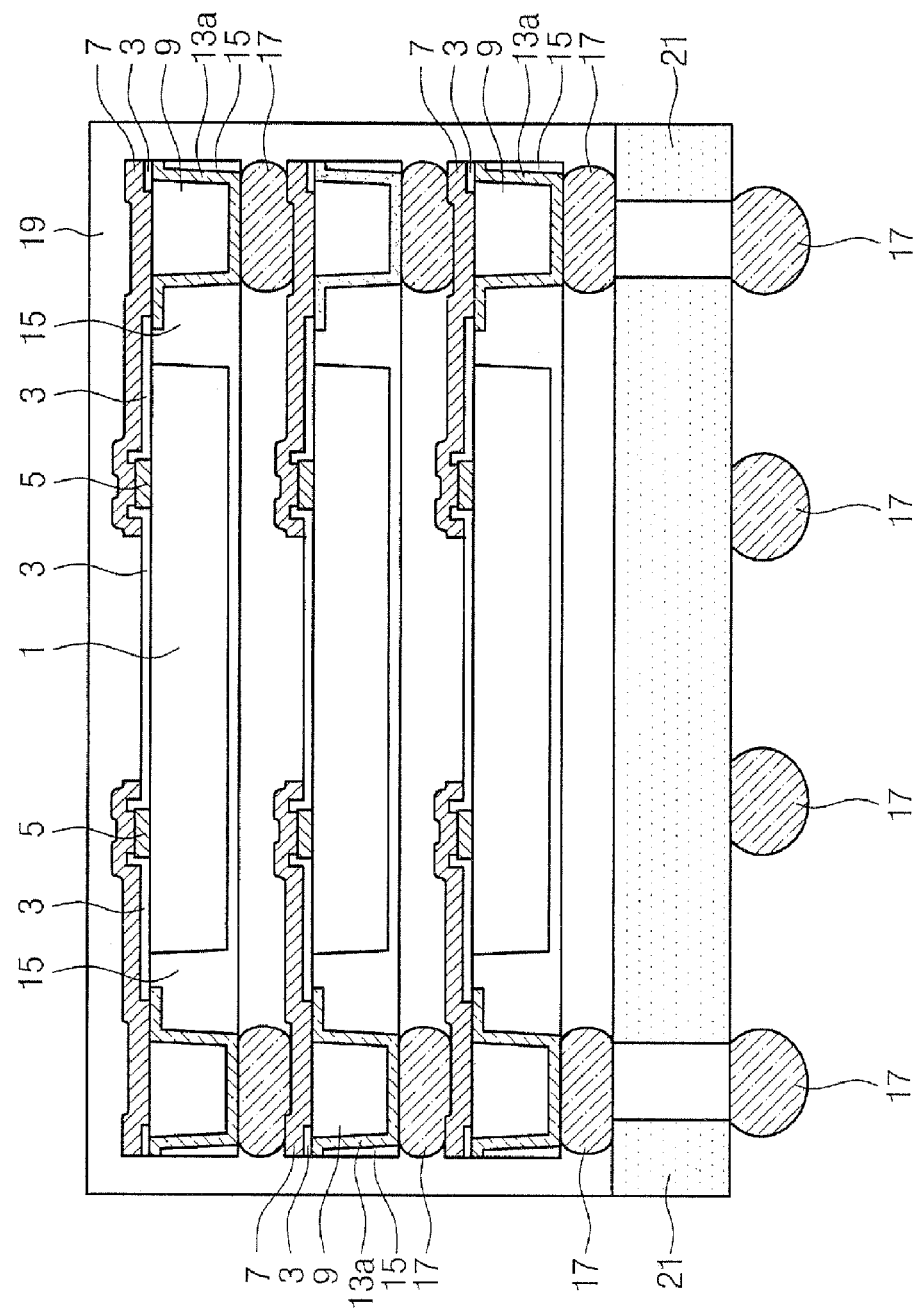
FIG. 12 is a sectional view of a chip-stack package according to an embodiment of the present invention.

Referring to FIGS. 4 and 11, an insulation layer 15 may be stacked and polished on the backside of the semiconductor substrate 1 to fill the opening 8. A portion of the insulation layer 15 may remain to cover the backside of the semiconductor substrate 1 in the chip region a by a thickness substantially similar to that of the metal pattern 13a. After forming the insulation layer 15, as shown in FIG. 4, the semiconductor chip is cut along line II-II' in the scribe line region b between the two neighboring chip regions a. Therefore, one semiconductor chip may be formed from each of the neighboring chip regions a. Then, a chip-stack package may be formed using the semiconductor chip as shown in FIG. 12. FIG. 12 is a sectional view of a chip-stack package according to an embodiment of the present invention.

Referring to FIG. 12, three semiconductor chips are sequentially stacked on a mounting substrate 21. The semiconductor chips are electrically connected to each other through bumps 17. Each of the bumps 17 may include a solder ball. The bumps 17 may be formed by various solder-ball attach methods or an electroplating method. The bumps 17 are attached at the bottom surface of the metal pattern 13a. Each bump 17 attached on the metal pattern 13a, which is located below one of the semiconductor chips, contacts the redistribution pattern 7 of the semiconductor chip located below. However, the semiconductor chip located at a lowest position, which is directly above the mounting substrate 21, is connected to the mounting substrate 21 by the bumps 17 attached to the lower surface of this semiconductor chip. The mounting substrate 21, which may be a printed circuit board, may be attached to other devices through a plurality of bumps 17 formed on its lower surface. The semiconductor chips may be covered by a sealing material 19, such as a plastic resin, on the mounting substrate 21 to be protected from outer moisture or impact.

Figure 13:
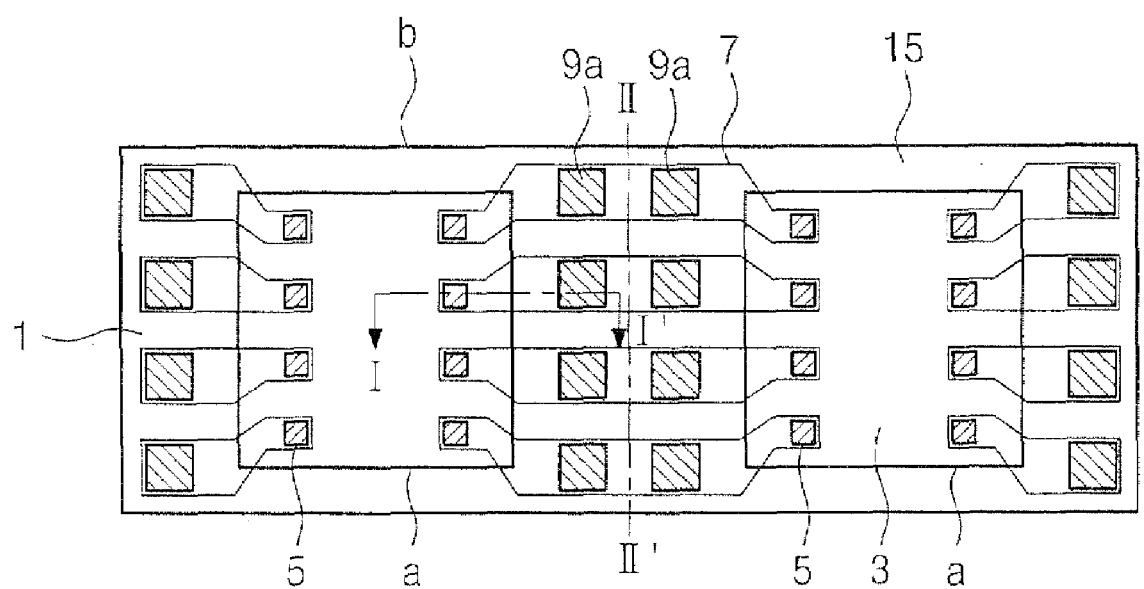
FIG. 13 is a plan view illustrating a method of forming a semiconductor chip according to another embodiment of the present invention.
Figure 14:
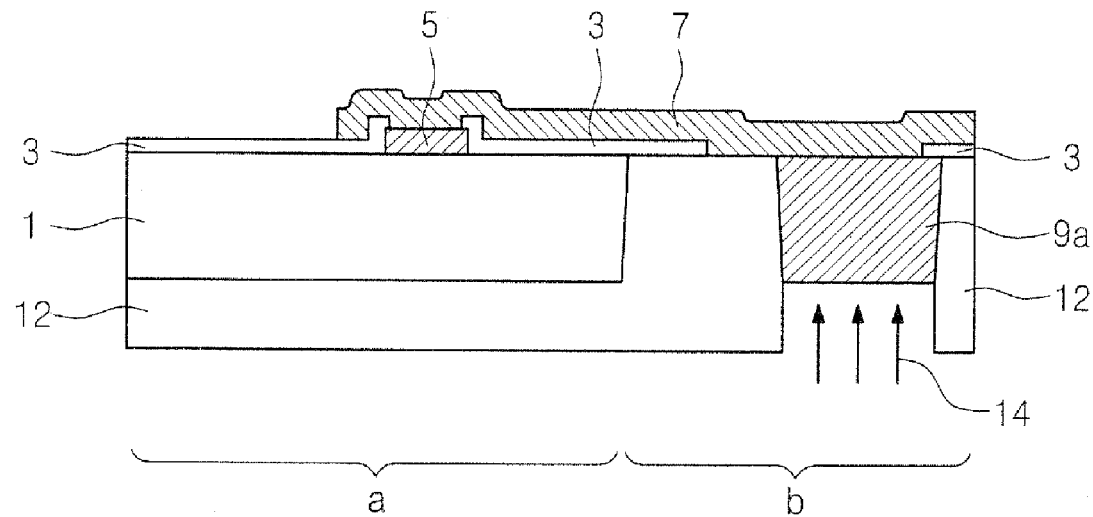
FIGS. 14 and 15 are sectional views illustrating a method of forming a semiconductor chip according to another embodiment of the present invention.
Figure 15:
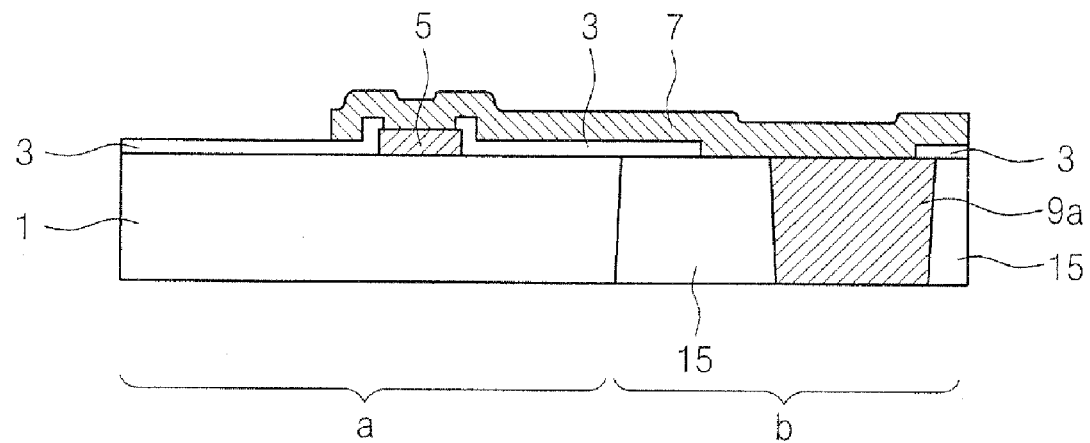

FIG. 13 is a plan view illustrating a method of forming a semiconductor chip according to another embodiment of the present invention. FIGS. 14 and 15 are sectional views illustrating a method of forming a semiconductor chip according to the above embodiment of the present invention. FIG. 15 is a sectional view taken by cutting along line I-I' in FIG. 13. FIG. 14 is a sectional view illustrating a detailed procedure of forming the semiconductor chip illustrated in FIG. 15.

Referring to FIG. 14, an ion-implantation mask pattern 12 is formed to cover a bottom surface and a sidewall of the chip region a of the semiconductor substrate 1 and expose only the semiconductor strut 9 in the scribe line region b, where the semiconductor strut 9 and the opening 8 have been previously formed by patterning the semiconductor substrate 1 at the scribe line region b in a method such as the one described above FIGS. 5-7. The ion-implantation mask pattern 12 may be a photoresist pattern. Then, an ion-implantation process is carried out so that the semiconductor strut 9 is doped by impurity ions 14. This doping process may change the semiconductor strut 9 into a conductive semiconductor strut 9a. Then, the ion-implantation mask 12 is removed. If this process is finished in the state of FIG. 14, there may exist a risk that the conductive semiconductor strut 9a may be separated from the redistribution pattern 7 and the protective layer 3 because of the weight of the conductive semiconductor strut 9a. In order to prevent this separation, the following process may be carried out.

Figure 16:
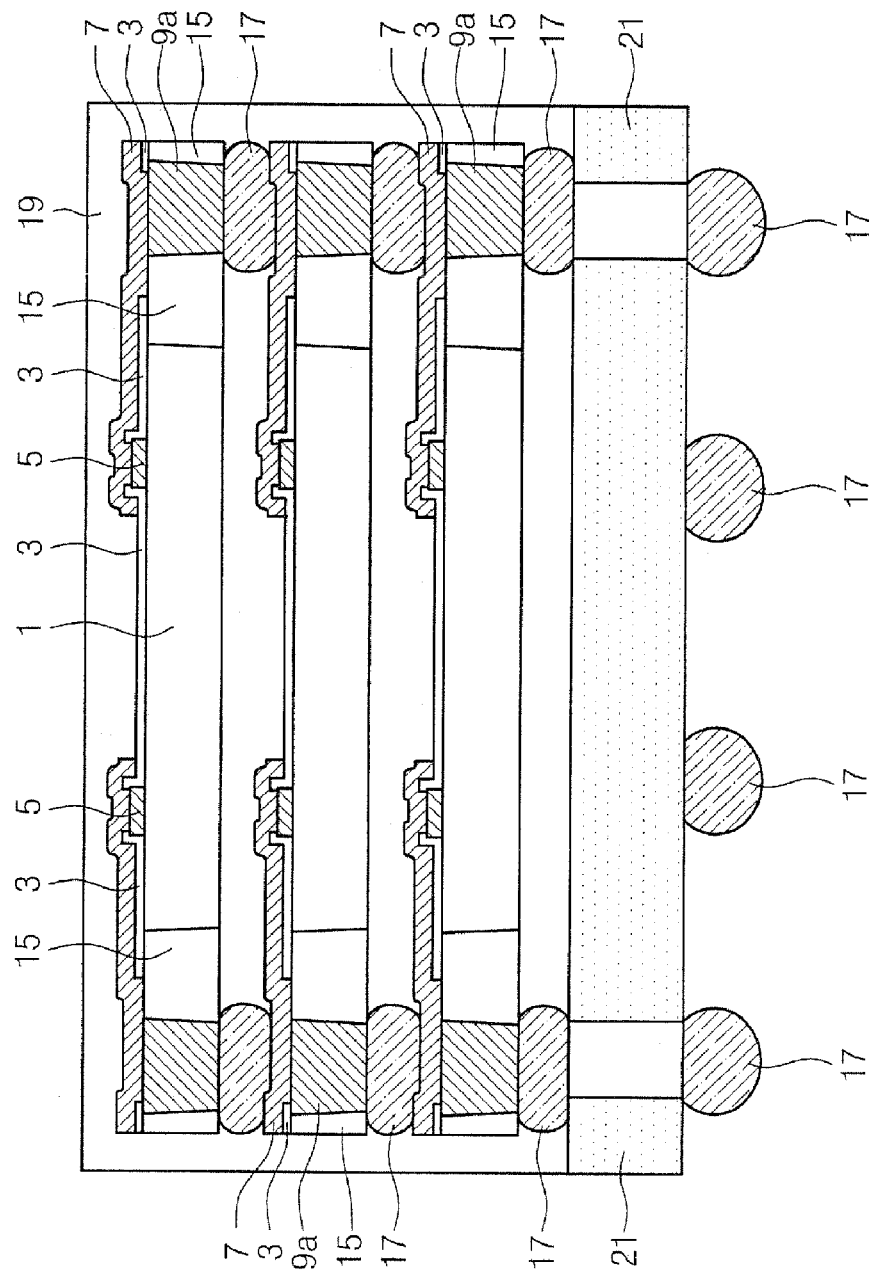
FIG. 16 is a sectional view of a chip-stack package according to another embodiment of the present invention.

Referring to FIGS. 13 and 15, an insulation layer 15 is stacked on the backside of the semiconductor substrate 1 and polished to fill the opening 8. Unlike the above embodiment shown in FIG. 11, the insulation layer 15 may be completely removed on the backside of the portion of the semiconductor substrate 1 in the chip region a because a metal pattern 13a need not be formed over the conductive semiconductor strut 9a. Eliminating this extra thickness of the metal pattern 13a and insulation layer 15 in the chip region a may reduce the height, and hence overall size, of the resulting semiconductor chip. The insulation layer 15 insulates the conductive semiconductor strut 9a from the semiconductor substrate 1 and supports the conductive semiconductor strut 9a by being attached on a sidewall of the conductive semiconductor strut 9a. After forming the insulation layer 15, as shown in FIG. 15, the semiconductor chip is cut along line II-II' in the scribe line region b between two neighboring chip regions a. Therefore, one semiconductor chip may be formed from each of the separated chip regions a. Then, a chip-stack package may be formed using the semiconductor chip as shown in FIG. 16. FIG. 16 is a sectional view of a chip-stack package according to another embodiment of the present invention.

Referring to FIG. 16, three semiconductor chips are sequentially stacked on a mounting substrate 21. The semiconductor chips are electrically connected to each other through bumps 17. Each bump 17 is attached to a bottom surface of the conductive semiconductor strut 9a. The bump 17 attached on the conductive semiconductor strut 9a located below one of the semiconductor chips contacts the redistribution pattern 7 of a lower semiconductor chip. However, the semiconductor chip located at a lowest position, which is directly above the mounting substrate 21, is connected to the mounting substrate 21 by the bumps 17 attached to the lower surface of this semiconductor chip. The mounting substrate 21, which may be a printed circuit board, may be attached to other devices by a plurality of bumps 17 formed on its lower surface. The semiconductor chips may be covered by a sealing material 19, such as a plastic resin, on the mounting substrate 21 to be protected from outer moisture or impact.

Although not illustrated, various embodiments of the present invention exist. For example, in other embodiments, a metal pattern 13a may the surface of the conductive semiconductor strut 9a. In still another embodiment, a semiconductor chip having only the semiconductor strut 9 of FIG. 7 may be used. Alternatively, in still another embodiment, an insulation layer 15 may not be formed, and then, a semiconductor chip without the insulation layer 15 may be used.

Accordingly, the present invention provides methods of fabricating semiconductor chips, semiconductor chips formed by the methods, and chip-stack packages having the semiconductor chips. The method includes patterning a scribe line region of a semiconductor substrate to form a semiconductor strut spaced apart from the semiconductor substrate of a chip region. Therefore, the semiconductor strut may be used as a means of an outer connection terminal, thereby simplifying a chip stacking arrangement and process. Furthermore, when the semiconductor strut is formed, it may be easy to control the gap between the semiconductor strut and the semiconductor substrate so that leakage current may be prevented. Additionally, sizes and features of the semiconductor strut may be easily controlled to be suitable for sizes and features of a sequential bump, thereby improving the reliability of the semiconductor chips.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a semiconductor chip, the method comprising:
   preparing a semiconductor substrate comprising a chip region and a scribe line region;
   forming a bonding pad on the chip region of the semiconductor substrate;
   forming a protective layer to cover a portion of the semiconductor substrate, the protective layer exposing a portion of the bonding pad and a portion of the scribe line region;
   forming a redistribution pattern overlying the protective layer, the redistribution pattern electrically coupled to the exposed portion of the bonding pad and covering the exposed scribe line region; and
   removing a portion of the semiconductor substrate located below the redistribution pattern in the scribe line region to form a semiconductor strut contacting the redistribution pattern.

2. The method of fabricating a semiconductor chip according to claim 1, further comprising forming a conductive pattern on a sidewall portion of the semiconductor strut, a bottom portion of the semiconductor strut, and a portion of the redistribution pattern exposed by the removed portion of the semiconductor substrate.

3. The method of fabricating a semiconductor chip according to claim 2, further comprising forming an insulation layer to fill a gap between the semiconductor substrate and the semiconductor strut.

4. The method of fabricating a semiconductor chip according to claim 2, wherein forming the conductive pattern further comprises forming the conductive pattern on a portion of the protective layer.

5. The method of fabricating a semiconductor chip according to claim 1, further comprising performing an ion-implantation process to implant impurities into the semiconductor strut.

6. The method of fabricating a semiconductor chip according to claim 5, further comprising forming an insulation layer to fill a gap between the semiconductor substrate and the semiconductor strut.

7. A semiconductor chip comprising:
a bonding pad located on a semiconductor substrate;
a protective layer overlying a portion of the semiconductor substrate and exposing a portion of the bonding pad and a portion of the semiconductor substrate;
a redistribution pattern overlying the protective layer, electrically coupled to the bonding pad and covering the exposed portion of the semiconductor substrate; and
a semiconductor strut spaced apart from edges of the semiconductor substrate, the semiconductor strut formed to contact the redistribution pattern.

8. The semiconductor chip of claim 7, further comprising a conductive pattern formed over a sidewall and a bottom of the semiconductor strut, the conductive pattern formed to contact the redistribution pattern.

9. The semiconductor chip of claim 8, further comprising an insulation layer filling a gap between the semiconductor substrate and the semiconductor strut.

10. The semiconductor chip of claim 8, wherein the conductive pattern is formed to contact a portion of the protective layer.

11. The semiconductor chip of claim 7, wherein the semiconductor strut is doped by impurity ions.

12. The semiconductor chip of claim 11, further comprising an insulation layer filling a gap between the semiconductor substrate and the semiconductor strut.

13. The semiconductor chip of claim 7, wherein the semiconductor strut is laterally spaced apart from the edges of the semiconductor substrate.

14. The semiconductor chip of claim 7, wherein an upper surface of the semiconductor strut is substantially coplanar with an upper surface of the semiconductor substrate.

15. The method of fabricating a semiconductor chip according to claim 1, wherein the semiconductor strut is formed in the scribe line region.

* * * * *